(12) United States Patent
Lee et al.

(10) Patent No.: US 9,252,742 B2
(45) Date of Patent: Feb. 2, 2016

(54) ANALOG FILTER IN WIRELESS TRANSMISSION/RECEPTION DEVICE AND METHOD FOR SETTING CUT-OFF FREQUENCY USING THE SAME

(75) Inventors: Jong-Woo Lee, Yongin-si (KR); Si-Bum Jun, Hwaseong-si (KR)

(73) Assignee: Samsung Electronics Co., Ltd (KR)

( * ) Notice: Subject to any disclaimer, the term of this patent is extended or adjusted under 35 U.S.C. 154(b) by 506 days.

(21) Appl. No.: 13/572,280

(22) Filed: Aug. 10, 2012

(65) Prior Publication Data

US 2013/0040592 A1 Feb. 14, 2013

(30) Foreign Application Priority Data

Aug. 10, 2011 (KR) .................. 10-2011-0079886

(51) Int. Cl.
*H04B 17/00* (2015.01)
*H03H 11/12* (2006.01)
*H04B 17/21* (2015.01)

(52) U.S. Cl.
CPC ............ *H03H 11/1291* (2013.01); *H04B 17/21* (2015.01)

(58) Field of Classification Search
CPC ............ H03F 2203/45264; H03F 2203/45521; H04B 17/04; H04B 17/00; H04B 17/20; H04B 17/23; H04B 17/0057; H04B 17/0062
USPC ................ 455/226.1–226.5, 227, 230, 233.1, 455/240.1, 245.1, 306, 213, 239.1, 130, 136
See application file for complete search history.

(56) References Cited

U.S. PATENT DOCUMENTS

| | | | |
|---|---|---|---|
| 2008/0096514 A1* | 4/2008 | Rahman et al. | 455/307 |
| 2011/0169591 A1* | 7/2011 | Kim et al. | 333/175 |
| 2013/0040592 A1* | 2/2013 | Lee et al. | 455/226.1 |

* cited by examiner

*Primary Examiner* — Nay A Maung
*Assistant Examiner* — Angelica M Perez
(74) *Attorney, Agent, or Firm* — The Farrell Law Firm, P.C.

(57) ABSTRACT

A method and an apparatus are provided for setting a cut-off frequency of an analog filter of a reception device for wireless communication. A deviation value is obtained that corresponds to an error between a first gain value based on an ideal transfer function curve and a second gain value based on a measured transfer function curve at an arbitrary frequency of a frequency band in which a constant interval is maintained between a slope of the ideal transfer function curve and a slope of the measured transfer function curve. A cut-off frequency that is used to measure the measured transfer function curve in a real environment, is corrected based on the obtained deviation value.

10 Claims, 8 Drawing Sheets

ANALOG FILTER IN WIRELESS TRANSMISSION/RECEPTION DEVICE AND METHOD FOR SETTING CUT-OFF FREQUENCY USING THE SAME

PRIORITY

This application claims priority under 35 U.S.C. §119(a) to a Korean Patent Application filed in the Korean Intellectual Property Office on Aug. 10, 2011 and assigned Serial No. 10-2011-0079886, the entire disclosure of which is incorporated herein by reference.

BACKGROUND OF THE INVENTION

1. Field of the Invention

The present invention relates generally to an analog filter in a wireless transmission/reception device, and more particularly, to an analog filter for correcting a cut-off frequency in a wireless transmission/reception device, and a method for setting a cut-off frequency using the same.

2. Description of the Related Art

Generally, in wireless communication systems, reception devices use an analog filter to remove unwanted signals, such as, for example, noises from received baseband signals, and to obtain desired channel signals. The analog filter must set an exact cut-off frequency in order to obtain the desired channel signals. Specifically, the setting of the exact cut-off frequency in the analog filter may influence performance of wireless communication systems.

FIG. 1 is graph illustrating characteristics of a Low Pass Filter (LPF), which is an example of an analog filter. Specifically, FIG. 1 shows a relationship between a frequency value and a decibel (dB) value, indicating a gain value at a particular frequency, in describing a cut-off frequency of an LPF.

Generally, most of signals present in nature, such as, for example, sound and light waves, increase in strength exponentially. In order to more easily process signals with these properties, analog circuits express gain values and cut-off frequency values in a logarithmic scale.

For example, when a gain value is expressed in a logarithmic scale, the gain value undergoes logarithmic computation, is multiplied by 20, and is then used in dB. Additionally, when power is expressed in a logarithmic scale, the power value undergoes logarithmic computation, is multiplied by 10, and is then used in dB.

Common filters vary in input-output gain values as a frequency increases. Therefore, these filters have a pass band and a stop band on the entire frequency band. A boundary frequency, which is a reference frequency for distinguishing between the pass band and the stop band, is referred to as a 'cut-off frequency $f_c$'.

For example, in the LPF, the cut-off frequency $f_c$ is defined as a frequency having a gain value that is 3 dB lower than a Direct Current (DC) in the pass band, or a gain value at the low frequency. FIG. 1 shows that a gain value in the DC is Adc (dB) and a gain value at the cut-off frequency $f_c$ is Adc-3 (dB). Specifically, the gain value at the cut-off frequency $f_c$ is 3 dB lower than the gain value in DC.

FIG. 2 is a diagram illustrating an analog filter having the characteristic function of FIG. 1.

Referring to FIG. 2, an amplifier 150 may change its gain value and cut-off frequency $f_c$ by varying resistances of variable resistors 160 and 170. A gain value of the amplifier 150 in DC may be defined as $$\frac{R_b}{R_c},$$

and the cut-off frequency $f_c$ may be defined as $$\frac{1}{2\pi R_b C},$$

where $R_a$ represents a resistance of an input variable resistor 160, $R_b$ represents a resistance of a feedback variable resistor 170, and C represents a capacitance of a feedback capacitor 180.

However, since the resistances of the resistors 160 and 170 and capacitance of the capacitor 180, which constitute the analog circuit, may vary depending on the temperature and process conditions, their exact values may not be predicted. Therefore, even though a cut-off frequency $f_c$ is set in an analog filter, the set cut-off frequency $f_c$ may be different from its target value. Thus, in the analog filter having the structure of FIG. 2, the cut-off frequency $f_c$ is set by manually adjusting the variable resistor 170.

Commonly, an analog filter uses variable resisters whose resistances vary linearly. A cut-off frequency $f_c$ of the analog filter is inversely proportional to the resistances of the variable resistors. Therefore, in order to set an exact cut-off frequency $f_c$, the resistance and capacitance should coincide with their designed values. However, the resistance and capacitance may deviate from their designed values by a maximum of 30% due to changes in temperature and manufacturing processes.

By manually compensating for the deviation by extracting and applying several samples, a deviation due to normal distribution during the manufacturing process may be accurately compensated for. Additionally, a deviation due to a change in a time-varying temperature may also be compensated for.

A digital modem in reception devices, constituting wireless communication systems, compensates for signals that are output from the analog filter and then quantized. Additionally, a Phase Compensation Filter (PCF) compensates for a group phase delay of the signals output from the analog filter at a digital stage following the quantization stage.

However, a range in which the digital modem may achieve compensation is limited, and when the cut-off frequency is not set exactly, the digital modem may not fully filter out the noise frequencies (or blockers) adjacent to the signal frequency. This inability to fully filter significantly decreases the Signal to Noise Ratio (SNR) in the reception devices causing a degradation of the call quality and an increase in power consumption.

Further, if the cut-off frequency used in the analog filter is deviated, a digital phase correction filter for compensating for the group phase delay may worsen the phase delay, causing a deterioration of reception performance.

SUMMARY OF THE INVENTION

The present invention has been made to address at least the above problems and/or disadvantages and to provide at least the advantages described below. Accordingly, an aspect of the present invention provides a variable gain amplifier capable of changing a gain and a cut-off frequency in an analog filter for filtering analog signals, an analog filter capable of correcting a cut-off frequency to its target value in a variable frequency filter, and a cut-off frequency setting method therefor.

Another aspect of the present invention provides an analog filter capable of automatically correcting a cut-off frequency of a reception filter in real time regardless of the environmental conditions, and a cut-off frequency setting method therefor.

Another aspect of the present invention provides an analog filter for measuring, in real time, a deviation between an initial value of a cut-off frequency of a reception filter and its designed value using an output frequency of a transmission device, and correcting the cut-off frequency by a control code capable of correcting the measured deviation value, and a cut-off frequency setting method therefor.

In accordance with one aspect of the present invention, a method is provided for setting a cut-off frequency of an analog filter of a reception device for wireless communication. A deviation value is obtained that corresponds to an error between a first gain value based on an ideal transfer function curve and a second gain value based on a measured transfer function curve at an arbitrary frequency of a frequency band in which a constant interval is maintained between a slope of the ideal transfer function curve and a slope of the measured transfer function curve. A cut-off frequency that is used to measure the measured transfer function curve in a real environment, is corrected based on the obtained deviation value.

In accordance with another aspect of the present invention, a reception device is provided for wireless communication and for setting a cut-off frequency of an analog filter. The reception device includes a digital processing unit for obtaining a deviation value corresponding to an error between a first gain value based on an ideal transfer function curve and a second gain value based on a measured transfer function curve at an arbitrary frequency of a frequency band in which a constant interval is maintained between a slope of the ideal transfer function curve and a slope of the measured transfer function curve. The reception device also includes a cut-off frequency setting unit for correcting a cut-off frequency that is used in the analog filter to measure the measured transfer function curve in a real environment, based on the obtained deviation value.

BRIEF DESCRIPTION OF THE DRAWINGS

The above and other aspects, features and advantages of the present invention will be more apparent from the following detailed description when taken in conjunction with the accompanying drawings, in which.

DETAILED DESCRIPTION OF EMBODIMENTS OF THE PRESENT INVENTION

Figure 1:
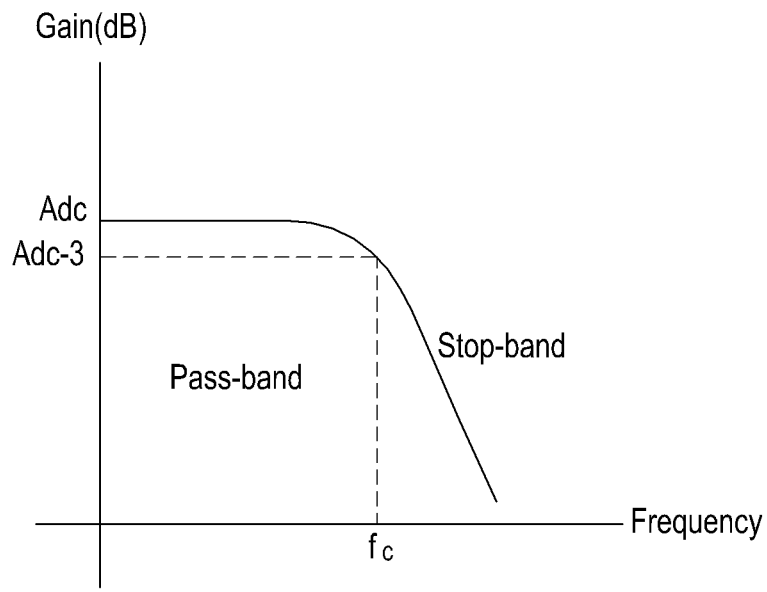
FIG. 1 is a graph showing characteristics of an LPF, which is an example of an analog filter.
Figure 2:
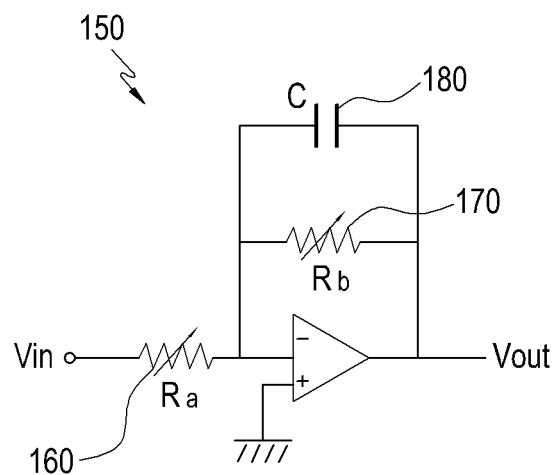
FIG. 2 is a diagram illustrating an analog filter having the characteristic function of FIG. 1.

Embodiments of the present invention are described in detail with reference to the accompanying drawings. The same or similar components may be designated by the same or similar reference numerals although they are illustrated in different drawings. Detailed descriptions of constructions or processes known in the art may be omitted to avoid obscuring the subject matter of the present invention.

Embodiments of the present invention provide a scheme for setting a cut-off frequency to be applied to an analog filter in a real environment, based on a cut-off frequency that is designed for an analog filter in an ideal environment.

A cut-off frequency of an analog filter to be applied in the real environment is set based on a deviation between transfer characteristics (hereinafter 'designed transfer characteristics') corresponding to output signals of the analog filter based on design, and transfer characteristics (hereinafter 'measured transfer characteristics') corresponding to output signals of the analog filter in the real environment. A transfer function defined by a frequency and a gain value may be used as the designed transfer characteristics and the measured transfer characteristics. Specifically, the designed transfer characteristics may be defined as a designed transfer function, and the measured transfer characteristics may be defined as a measured transfer function.

For example, a deviation between the designed transfer function and the measured transfer function corresponds to a difference value (hereinafter 'deviation value') between gain values obtained for a specific frequency. The specific frequency exists in a frequency band in which a curve by the designed transfer function (hereinafter 'designed transfer function curve') and a curve by the measured transfer function (hereinafter referred to as a 'measured transfer function curve') have similar or uniform slopes. An example of a gain value may be pass power. Therefore, in the following description of embodiments of the present invention, 'gain value' and 'pass power' of a terminal have the same meaning.

Based on the deviation value obtained as described above, a reception device sets a cut-off frequency (hereinafter 'measured cut-off frequency') that is used to measure a transfer function curve in the real environment. For example, the measured cut-off frequency may be obtained by correcting a cut-off frequency (hereinafter 'designed cut-off frequency') of an analog filter based on design, using the obtained deviation value.

Embodiments of the present invention are described in detail below, with reference to the accompanying drawings. However, the embodiments of the present invention are not limited to those shown in the accompanying drawings.

Additionally, the accompanying drawings, which are provided for a description of embodiments of the present invention, may be simplified or exaggerated to highlight features of these embodiments of the present invention. For example, in the accompanying drawings, the size of each element may not exactly coincide with that in its actual implementation.

Figure 3:
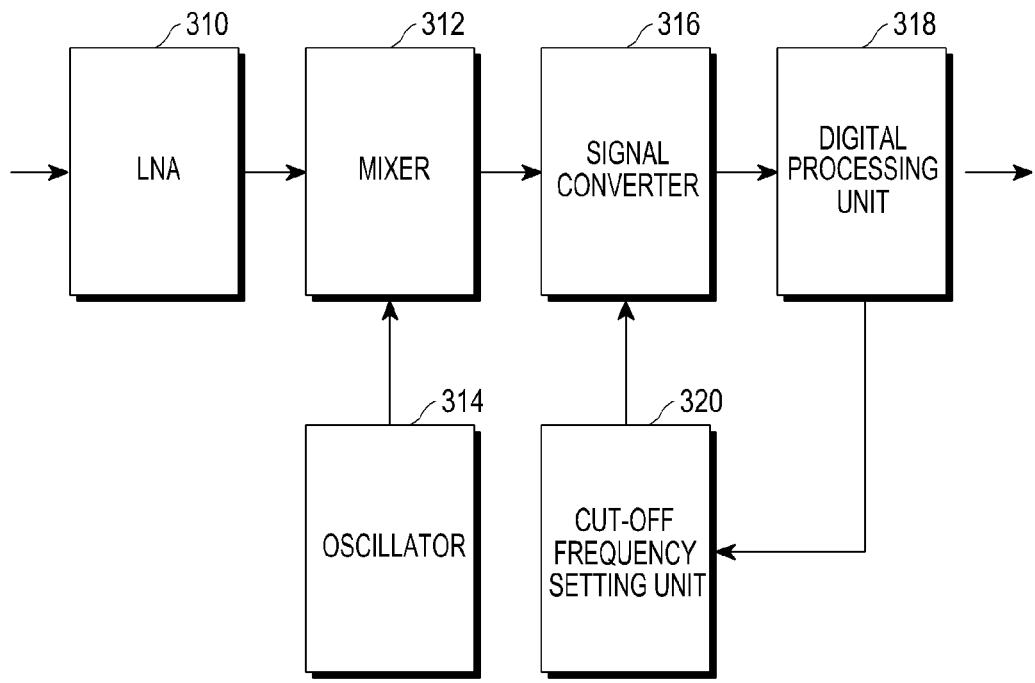
FIG. 3 is a diagram illustrating a reception device capable of correcting a cut-off frequency, according to an embodiment of the present invention.

FIG. 3 is a diagram illustrating a structure of a reception device capable of correcting a cut-off frequency, according to an embodiment of the present invention. It is assumed that in the structure of the reception device, as shown in FIG. 3, a transiting signal is generated by the reception device and applied to an input of the reception device to set a cut-off frequency. However, the embodiments of the present invention are not limited to the structure shown in FIG. 3. As another example, an embodiment of the present invention may also be applied to an environment where an external device applies a training signal to an input of the reception device, or applies a training signal received in a wireless environment to an input of the reception device. However, it may be preferable for the reception device to generate a training signal and apply it to the reception device, in order to modulate the signal by an exact cut-off frequency before its application.

Referring to FIG. 3, the reception device includes a Low Noise Amplifier (LNA) 310, a mixer 312, an oscillator 314, a signal converter 316, a digital processing unit 318, and a cut-off frequency setting unit 320.

The LNA 310 low-noise-amplifies input signals at a set amplification rate. The signals amplified by the LNA 310 are applied to an input of the mixer 312.

The mixer 312 outputs intermediate frequency band signals by mixing radio frequency band signals received from the LNA 310 with a carrier frequency generated by the oscillator 314. The mixer 312 applies the intermediate frequency band signals to an input of the signal converter 316.

The signal converter 316 obtains desired frequency band signals by filtering the intermediate frequency band signals received from the mixer 312 by the set cut-off frequency. It is important that the cut-off frequency is set exactly, taking into account, for example, the temperature and the process conditions, in order to obtain desired frequency band signals. A detailed description is provided below, in which the signal converter 316 sets or corrects the cut-off frequency to be used to filter the intermediate frequency band signals.

The signal converter 316 filters the intermediate frequency band signals using the cut-off frequency, which is set or corrected by the signal converter 316 under control of the cut-off frequency setting unit 320, or using the cut-off frequency, which is set or corrected by the cut-off frequency setting unit 320.

The signal converter 316 amplifies the filtered baseband signals by a predetermined amplification rate, and converts the amplified analog baseband signals into digital signals. The signal converter 316 applies the digital signals to the digital processing unit 318.

The digital processing unit 318 processes the digital signals received from the signal converter 316. The digital processing unit 318 calculates a cut-off frequency deviation for setting or correcting the cut-off frequency for the signal converter 316. Specifically, the digital processing unit 318 calculates a deviation value to be used to set or correct the cut-off frequency. The deviation value may be calculated by a deviation between a designed transfer function curve based on the designed transfer function and a measured transfer function curve based on the measured transfer function.

For example, the digital processing unit 318 obtains a pass power $P_{pass}$ at a pass frequency and a pass power $P_{fc}$ at the cut-off frequency to measure a deviation value.

The pass power $P_{pass}$ at the pass frequency may be obtained based on the signal that is output from an analog filter by applying, to an input of the reception device, a training signal of a single tone having a pass frequency $f_{test1}$ (e.g., 1/10 of the cut-off frequency) that is significantly lower than the cut-off frequency. The training signal, which is applied to the input of the reception device, may be generated by a transmission device or a separate device other than the transmission device, or may be received over a wireless channel.

The pass power $P_{fc}$ at the cut-off frequency may be obtained based on the signal that is output from an analog filter by applying, to an input of the reception device, a training signal of a single tone having a frequency $f_{test2}$ (e.g., a designed cut-off frequency) that is higher than the pass frequency. The training signal applied to the input of the reception device may be generated by a transmission device, or a separate device other than the transmission device, or may be received over a wireless channel.

The cut-off frequency that is used to obtain the pass power $P_{pass}$ at the pass frequency and the pass power $P_{fc}$ at the cut-off frequency is also used to obtain a desired transfer function frequency during design of the actual circuit. Specifically, the cut-off frequency is in the designed transfer function curve.

Upon obtaining the pass power $P_{pass}$ at the pass frequency and the pass power $P_{fc}$ at the cut-off frequency, the signal processing unit 318 obtains a deviation value based on a difference from the pass power '$P_{pass}$–3 dB' at a cut-off frequency of an ideal transfer function. Specifically, the deviation value $\Delta P_{fc}$ may be obtained by $P_{pass}$–3 dB–$P_{fc}$. The formula for calculating the deviation value considers a critical error value to be 3 dB.

However, when the training signal $f_{test2}$ for obtaining the pass power $P_{fc}$ is set as a cut-off frequency as in the foregoing example, an error may occur in the obtained pass power $P_{fc}$.

Figure 6:
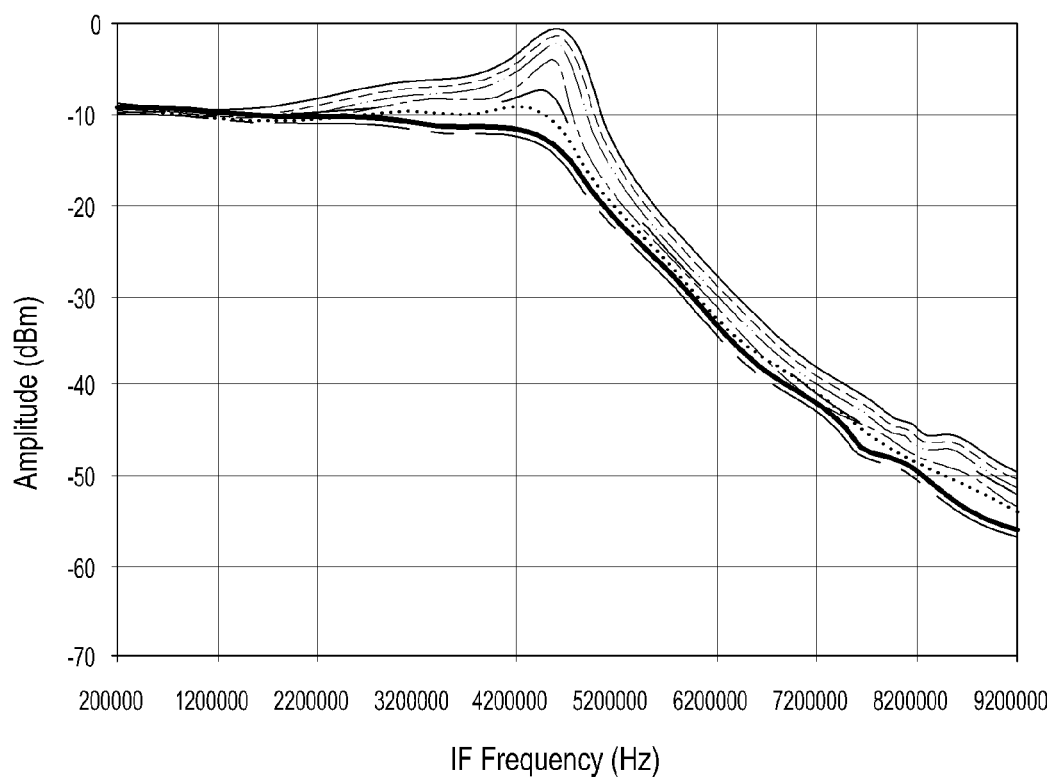
FIG. 6 is a graph showing a transfer function curve in a reception device for a wireless communication system, according to an embodiment of the present invention.

FIG. 6 is a graph showing the cause of an error occurring in obtained pass power $P_{fc}$ when a training signal $f_{test2}$ for obtaining pass power $P_{fc}$ is set as a cut-off frequency.

More specifically, a quality factor of the cut-off frequency set in the analog filter varies due to errors occurring in individual elements by the actual manufacturing process and temperature.

For example, as shown in FIG. 6, overshooting or droop occurs in the vicinity of the cut-off frequency (approximately 4.6 MHz). Signal strength at the cut-off frequency (approximately 4.6 MHz) may lose its accuracy. On the contrary, in a frequency band higher than the cut-off frequency (approximately 4.6 MHz), slopes of the designed transfer function curve and the measured transfer function curves are uniformly distributed or alike. Specifically, there is a frequency section in which a constant interval is maintained between a slope of the designed transfer function curve and a slope of the measured transfer function curve.

If applied to a $5^{th}$-order analog filter, the slopes of the transfer function curves for a specific frequency higher than the cut-off frequency may be –100 dB/dec. This means that if the frequency increases 10 times, the transfer function gain may decrease below 100 dB. Therefore, a deviation value of the cut-off frequency is $\Delta f_c = 10^{-\Delta Pfc/100\ dB}$.

If the $5^{th}$-order analog filter uses an N frequency of the cut-off frequency as $f_{test2}$, it uses a value of $-100 \times \log_{10}(N) - 3$ instead of –3 dB. For example, in FIG. 6, when distortion due to the quality factor is greatest or highest at the cut-off frequency of 4.6 MHz, if a signal of 6 MHz, which is 1.3 times 4.6 MHz, is applied, signal strength reduction of as much as −14.7 dB may be expected. In addition, a signal of −24.7 dB may be expected at 6 MHz since the gain in the pass band is −10 dB.

FIG. 6 also shows a transfer function in the actually implemented analog filter, and even in this transfer function, the analog filter shows signal strength of −24.7 dB without distortion at the frequency of 6 MHz.

If the cut-off frequency of the actual circuit where a deviation has occurred is higher than the designed ideal cut-off frequency, the pass power deviation always has a fixed value (e.g., 3 dB). Thus, the analog filter may approximate the ideal value of the pass power deviation by repeatedly applying the algorithm two or three times. However, if $f_{test2}$ is 1.2 times or more of the cut-off frequency, as described above, the fixed-value deviation rarely occurs.

Figure 7:
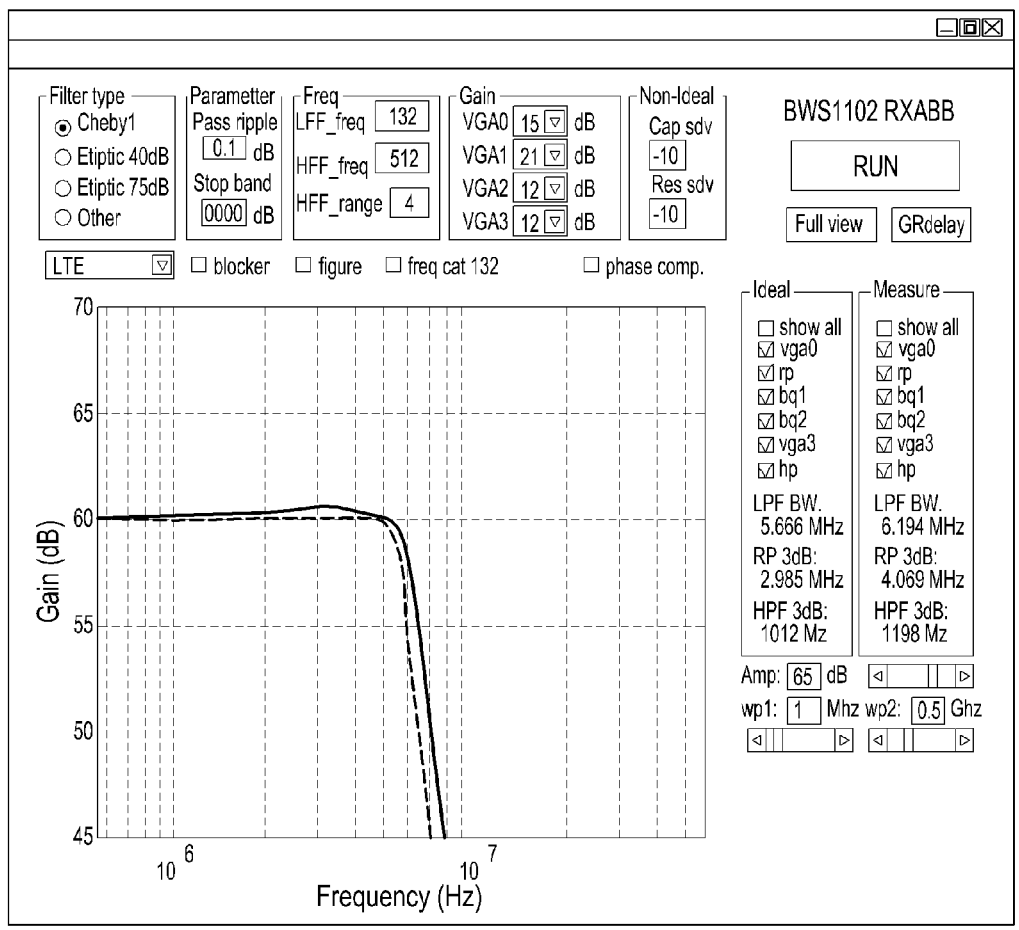
FIG. 7 illustrates a screen having transfer function curves of an LPF for filtering a baseband in a terminal receiver of Long Term Evolution (LTE) used as the $4^{th}$ Generation (4G) mobile communication standard, according to an embodiment of the present invention.

FIG. 7 is a screen showing transfer function curves of an LPF for filtering a baseband in a terminal receiver of LTE used as the 4G mobile communication standard, according to an embodiment of the present invention.

In FIG. 7, a solid line represents an ideal transfer function (or designed transfer function), and a dotted line represents a transfer function (or measured transfer function) where a deviation has occurred due to the manufacturing process and temperature. The cut-off frequency value is LPF Bandwidth (BW), and in the ideal case, the cut-off frequency value is equal to 5.666 MHz. The measured cut-off frequency at which a deviation has occurred is 6.194 MHz, and the deviation is 9.3%.

In this state, no correction algorithm is applied, the frequency quality is not checked, and an initial control code value is 132.

Figure 8:
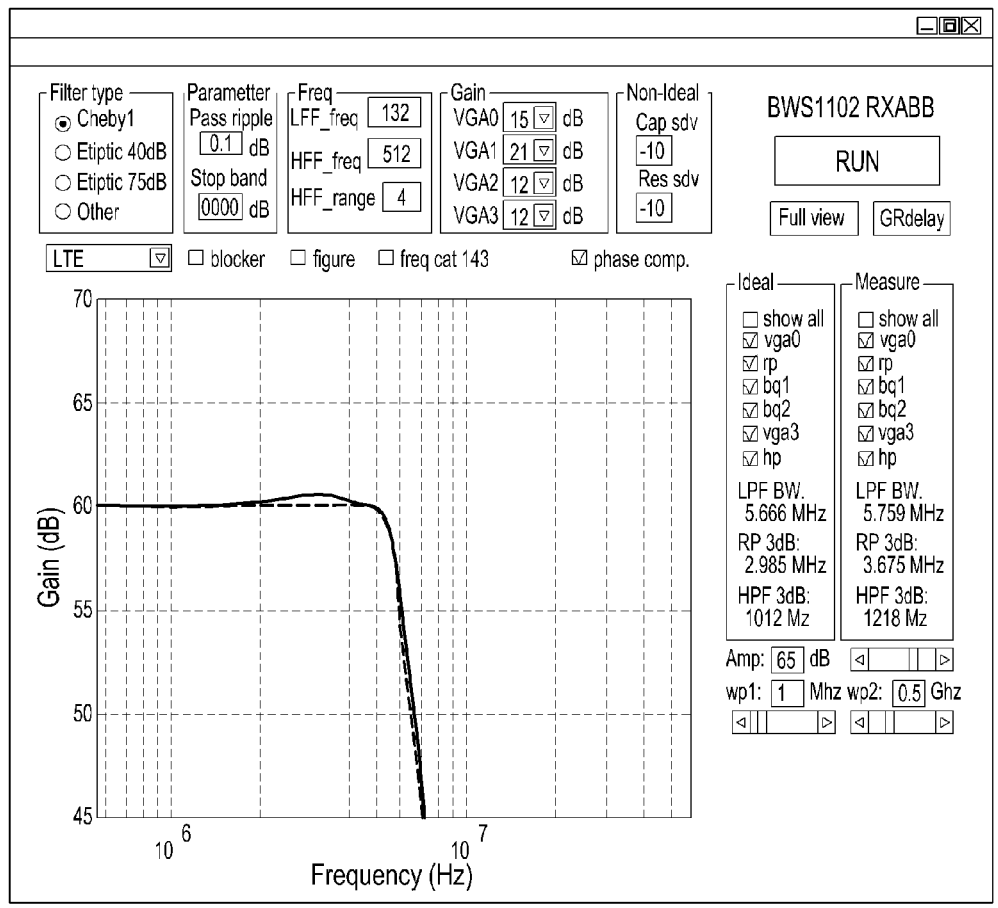
FIG. 8 illustrates a screen having transfer function curves obtainable by checking a frequency quality using a correction algorithm, according to an embodiment of the present invention.

FIG. 8 is a screen showing transfer function curves obtainable by checking the frequency quality using a correction algorithm, according to an embodiment of the present invention.

A control code value of 143 is automatically calculated by the equation below based 5 on the above-described deviation value. The existing control code value is changed to the automatically calculated value of 143. Therefore, a cut-off frequency of the new transfer function is set as 5.759 MHz, and the deviation value is dramatically reduced to 1.6%.

Referring back to FIG. 3, the deviation value obtained by the digital processing unit 318, as described above, is applied to the cut-off frequency setting unit 320.

The cut-off frequency setting unit 320 sets or corrects the cut-off frequency of the analog filter provided in the signal converter 316 to filter the intermediate frequency band signals using the deviation value received from the digital processing unit 318.

Figure 5:
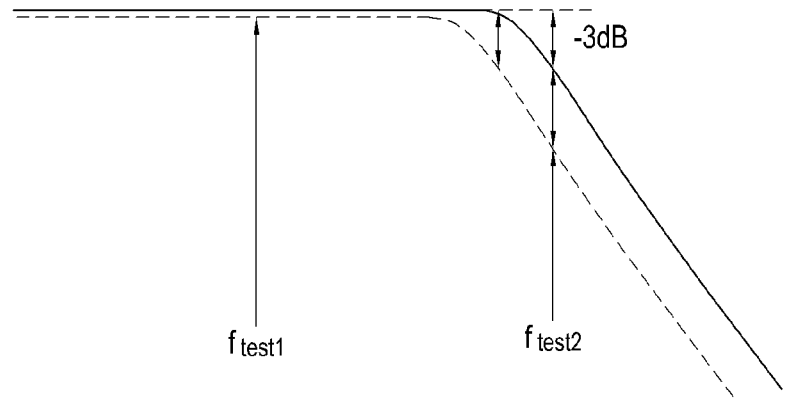
FIG. 5 is a graph showing a transfer function for signal strength of an analog filter, according to an embodiment of the present invention.

FIG. 5 is a graph showing a transfer function for signal strength of an analog filter, according to an embodiment of the present invention.

In FIG. 5, a bold solid line represents a designed transfer function curve based on the designed ideal transfer function (e.g., designed transfer function), and a dotted line represents a measured transfer function curve based on the actual transfer function (e.g., measured transfer function) where a deviation has occurred during the manufacturing process.

As shown in FIG. 5, at a cut-off frequency of the designed transfer function curve corresponding to the ideal case, the analog filter has a gain value of −3 dB. On the contrary, an error of as much as $\Delta P_{fc}$ occurs at the cut-off frequency of the measured transfer function curve corresponding to the actual transfer function.

Therefore, in order to set or correct the cut-off frequency, a method of compensating for an error of as much as $\Delta P_{fc}$ is required.

For example, the cut-off frequency has a value that is inversely proportional to the control code. Therefore, if an initial control code is defined as LPF_code, the cut-off frequency $f_c$ has a value of '1000/(2π*100*LPF_code*X)', where X represents a constant value based on the characteristics of the transfer function.

However, as described above, the pass power in the actual circuit of the analog filter has an error (e.g., deviation value) of as much as $\Delta P_{fc}$, compared with the designed pass power. Therefore, the actual analog filter forms a cut-off frequency different from the designed cut-off frequency. If a control code value is corrected by measuring the above-defined deviation value, a transfer function approximating the designed cut-off frequency may be obtained. Examples of measuring the deviation value are described in detail above.

Figure 4:
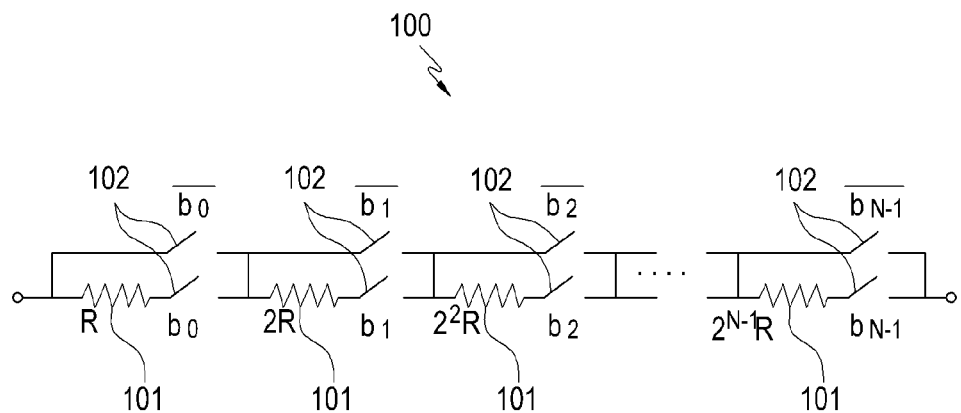
FIG. 4 is a diagram illustrating variable storage constituting an analog filter to which an embodiment of the present invention is applicable.

FIG. 4 is a diagram illustrating variable storage constituting an analog filter to which an embodiment of the present invention is applicable.

Referring to FIG. 4, a variable resistor includes a plurality of resistive segments 101 therein, and the analog filter includes switches 102 for controlling connections of the resistive segments 101. Generally, an integrated circuit digitally controls a binary variable resistor array, and during production, factory default values are recorded in a storage device by manually adjusting a sampling circuit.

The switches 102 control connections of the resistive segments 101 by being closed or open in response to bits $b_0, b_1, \ldots b_{N-1}$ or bit combinations $b_0 b_1, b_0 b_2, b_1 b_2, \ldots b_0 b_2, \ldots b_{N-2} b_{N-1}$ of an N-bit control signal. Specifically, resistances of the resistive segments 101 are determined in accordance with predetermined rules. The resistances of the resistive segments 101 are determined depending on the bits $b_0, b_1, \ldots b_{N-1}$ for controlling the associated switches.

Given the foregoing description, for a variable resistor 100 shown in FIG. 4, its entire resistance is determined in proportion to an integer k that is generated as a combination of bits $b_0$ to $b_{N-1}$ of an N-bit control signal.

The integer k may be defined by Equation (1) below.

$$k = b_0 + 2^1 b_1 + 2^2 b_2 + \ldots + 2^{N-1} b_{N-1}, (0 \leq k \leq 2^B - 1) \quad (1)$$

In accordance with Equation (1), a variable frequency filter uses a variable resistor whose resistance is proportional to an integer k that is obtained by a combination of bits of an N-bit control signal.

This variable resistor may be applied to all analog filters that change the cut-off frequency by adjusting a resistance. An order of the analog filters may be set as a first order to a high order depending on their application. Generally, a reception device for wireless communication systems uses $5^{th}$-order filters.

Figure 9:
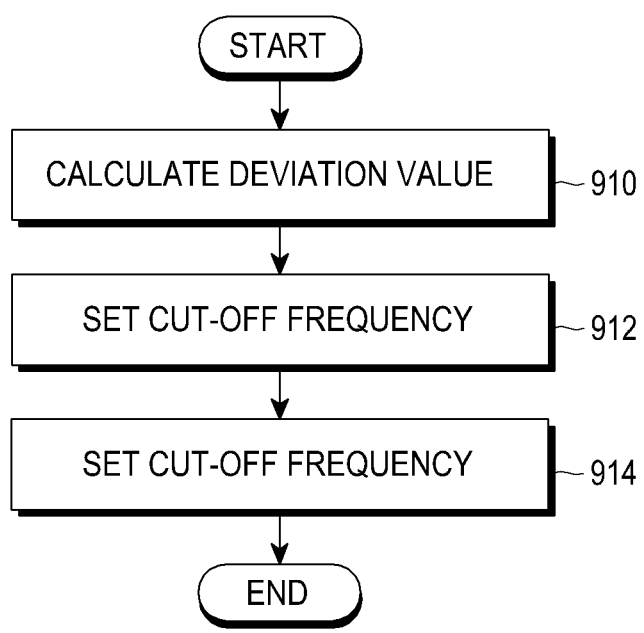
FIG. 9 is a flowchart illustrating setting of a cut-off frequency of an analog filter in a reception device, according to an embodiment of the present invention.

FIG. 9 is a flowchart illustrating setting of a cut-off frequency of an analog filter in a reception device, according to an embodiment of the present invention.

Referring to FIG. 9, the reception device calculates a deviation value corresponding to an error between a designed ideal gain value (pass power) and a gain value (pass power) based on actual measurement, in step 910.

The reception device obtains a deviation value from an error between a gain value (pass power) based on a designed transfer function curve and a gain value (pass power) based on a measured transfer function curve at an arbitrary frequency belonging to a frequency band that is higher than the cut-off frequency. The 'designed transfer function curve' refers to a designed ideal transfer function curve, and the 'measured transfer function curve' refers to a transfer function curve measured in a real environment.

For example, the reception device measures the pass power $P_{pass}$ corresponding to a first gain value by applying a training signal having a frequency $f_{test1}$, which is significantly lower than the cut-off frequency, to an input of the reception device. For example, the reception device may use a frequency corresponding to 1/10 of the cut-off frequency, as the frequency $f_{test1}$.

The obtained first gain value $P_{pass}$ is maintained constant despite a change in frequency in a preset frequency band on both the designed transfer function curve and the measured transfer function curve. Therefore, the pass power $P_{pass}$ corresponding to the first gain value is obtained based on a signal that is output from the analog filter by applying, to an input of the reception device, a signal of a single tone having a frequency lower than a cut-off frequency used to obtain the measured transfer function curve.

The reception device measures the pass power $P_{fc}$ corresponding to a second gain value by applying a training signal having a designed cut-off frequency $f_{test2}$, to an input of the reception device. For example, the reception device is assumed to use a designed cut-off frequency $f_{test2}$ as a frequency for measuring the pass power $P_{fc}$.

However, any frequency higher than the designed cut-off frequency $f_{test2}$ may be used as the frequency for measuring the pass power $P_{fc}$. The frequency for measuring the pass power $P_{fc}$ should be selected within a frequency band in which a gain value (e.g., pass power) exists, based on the designed transfer function curve.

The second gain value $P_{fc}$ is obtained at an arbitrary frequency belonging to a frequency band in which a gain value varies depending on a change in frequency on both the designed transfer function curve and the measured transfer function curve. Therefore, the pass power $P_{fc}$ corresponding to the second gain value is obtained based on a signal that is output from the analog filter by applying, to an input of the reception device, a signal of a single tone having a cut-off frequency used to obtain the designed transfer function curve.

As another example, the deviation value may be obtained by taking into account an error caused by overshooting or droop, which may occur in the analog filter. The analog filter has a frequency band in which a constant interval between a slope of the designed transfer function curve and a slope of the measured transfer function curve is maintained.

For example, the deviation value may be obtained by an error between a gain value based on the ideal transfer function curve and a gain value based on the measured transfer function curve at an arbitrary frequency belonging to a frequency band in which a constant interval is maintained between a slope of the designed transfer function curve and a slope of the measured transfer function curve.

Upon obtaining the deviation value, the reception device sets or corrects a cut-off frequency of the analog filter using the obtained deviation value, in step 912. Setting or correcting the cut-off frequency refers to adjusting a cut-off frequency so that the analog filter may operate depending on a transfer function curve that is as similar as possible to the designed transfer function curve.

For example, the cut-off frequency $f_c$ is determined by $1000/(2\pi*100*LPF\_code*X)$. Therefore, in order to change the cut-off frequency, the reception device should change LPF_code*X for defining the control code value. The LPF_code is a control code value (i.e., initial control code value) that is initially set for the analog filter. Commonly, this value is unchangeable. Therefore, the cut-off frequency $f_c$ may be adjusted by changing a constant value X, which is based on the characteristics of the transfer function.

The reception device adjusts the cut-off frequency of the analog filter by estimating a constant value X agreeing with the characteristics of the transfer function curve based on the obtained deviation value. Specifically, the reception device corrects a control code value for setting or correcting the cut-off frequency by the constant value X.

As described in detail above, the reception device determines a control code value of LPF-code*X by setting the constant value X using the obtained deviation value. The reception device obtains the cut-off frequency to be used in the analog filter by applying the determined control code value of LPF-code*X.

Upon obtaining the cut-off frequency by the deviation value, the reception device applies the obtained cut-off frequency to the analog filter, in step 914. Therefore, the analog filter may filter the intermediate frequency band signals with the set cut-off frequency.

Figure 10:
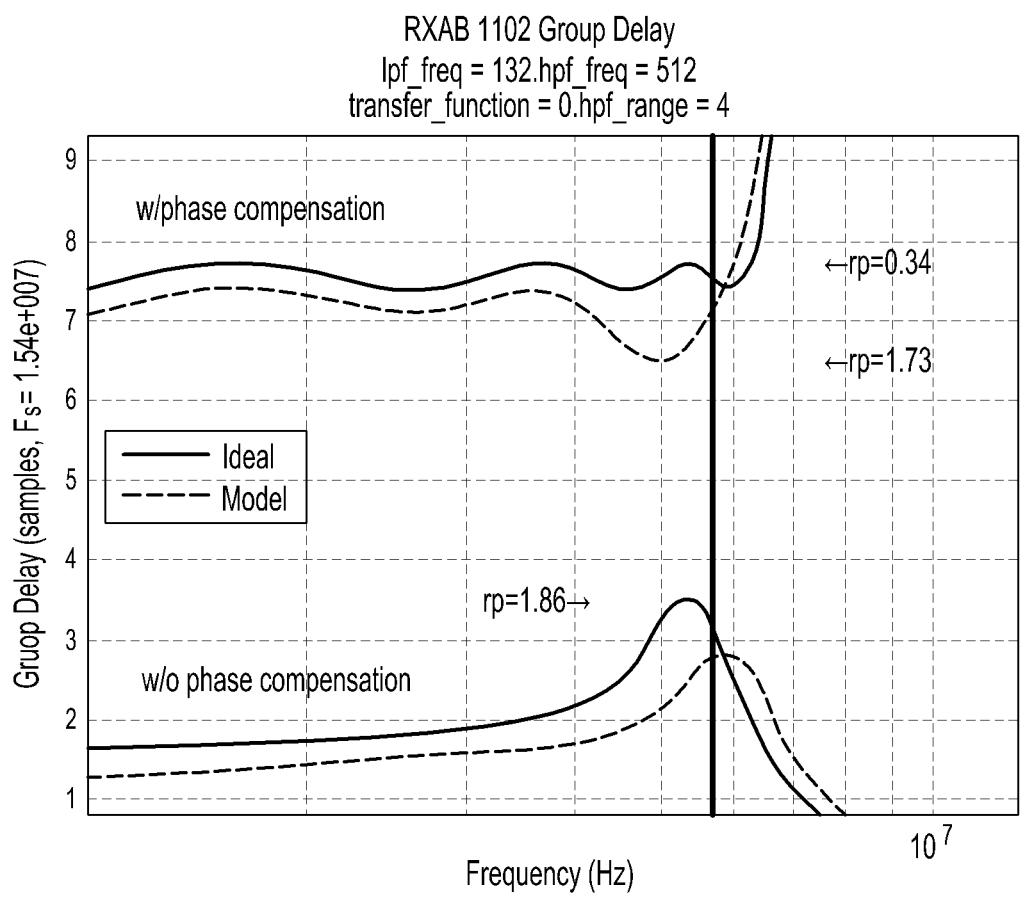
FIG. 10 is a graph showing a group phase function obtained by experiments in an LTE system to which the correction algorithm of an embodiment of the present invention is not applied.

FIG. 10 is a graph showing a group phase function obtained by experiments in an LTE system to which the correction algorithm of an embodiment of the present invention is not applied.

In FIG. 10, the top curves correspond to a group phase function obtained when a phase correction filter is applied after analog-to-digital conversion is carried out. The bottom curves correspond to a group phase function obtained when no phase correction filter is applied after analog-to-digital conversion is carried out.

Of the curves in FIG. 10, the solid line curves represent designed ideal deviation values, and the dotted line curves represent actual deviation values. In accordance with the two curves, a ripple value of a group phase delay determined when the phase correction filter is not applied, may fall within a range of 1.86 samples (=121 ns). However, a ripple value of a group phase delay determined when the phase correction filter is applied, may ideally fall within 0.34 samples (=22 ns). However, if the cut-off frequency does not coincide with the designed value as in the dotted line curves, the ripple value is 1.73 samples (=112 ns), so the improvement by the phase correction filter may be insignificant.

Figure 11:
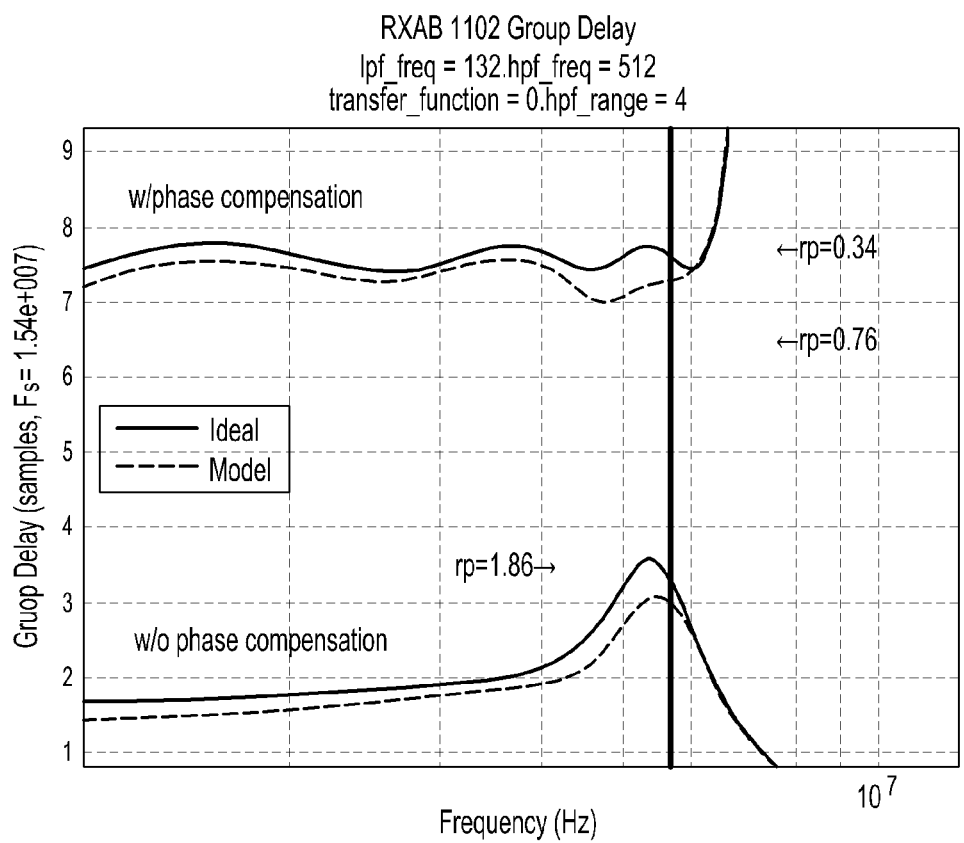
FIG. 11 is a graph showing a group phase function obtained by experiments in an LTE system to which the correction algorithm of an embodiment of the present invention is applied.

FIG. 11 is a graph showing a group phase function obtained by experiments in an LTE system to which the correction algorithm of an embodiment of the present invention is applied. In FIG. 11, the top curves correspond to a group phase function obtained when a phase correction filter is applied after analog-to-digital conversion is carried out. The bottom curves correspond to a group phase function obtained when no phase correction filter is applied after analog-to-digital conversion is carried out.

As shown in FIG. 11, the ripple value is reduced to 0.76 samples (=49 ns) when the correction algorithm proposed by an embodiment of the present invention is applied. Therefore, a group delay error required by an LTE system using 10 MHz is within 200 ns, and a group delay error required by an LTE system using 20 MHz is within 141 ns. The correction algorithm of an embodiment of the present invention stably meets the communication protocol requirements.

As is apparent from the foregoing description, embodiments of the present invention provide a feedback circuit and algorithm for correcting a cut-off frequency error of a variable frequency filter, which may occur due to a deviation by the manufacturing process and temperature, making it possible to measure a deviation value of the transfer function and to provide a control code of the variable frequency filter with an intuitive and simple algorithm.

In addition, embodiments of the present invention may dramatically reduce the cut-off frequency error, thereby contributing to an increase in communication receiver sensitivity and a decrease in power consumption. Accordingly, embodiments of the preset invention may omit the existing process of setting the factory default values, and remove the memory for storing initial values, making it possible to reduce the manufacturing cost and detect a deviation in real time, contributing to increase in the field of the products.

While the invention has been shown and described with reference to certain embodiments thereof, it will be understood by those skilled in the art that various changes in form and detail may be made therein without departing from the spirit and scope of the invention as defined by the appended claims and their equivalents.

What is claimed is:

1. A method for setting a cut-off frequency of an analog filter of a reception device for wireless communication, the method comprising the steps of:
   obtaining, by the reception device, a deviation value corresponding to an error between a first gain value based on an ideal transfer function curve and a second gain value based on a measured transfer function curve at an arbitrary frequency of a frequency band in which a constant interval is maintained between a slope of the ideal transfer function curve and a slope of the measured transfer function curve; and
   correcting, by the reception device, the cut-off frequency that is used to measure the measured transfer function curve in a real environment, based on the obtained deviation value,
   wherein the first gain value is maintained constant despite a change in frequency on both the ideal transfer function curve and the measured transfer function curve,
   the second gain value is obtained at a second arbitrary frequency of a second frequency band in which a gain value varies depending on a change in frequency on both the ideal transfer function curve and the measured transfer function curve, and
   the deviation value is obtained by subtracting the second gain value and a critical error value from the first gain value.

2. The method of claim 1, wherein correcting the cut-off frequency comprises estimating a constant value X based on the obtained deviation value, correcting a control code value LPF_code by the estimated constant value X, and obtaining a corrected cut-off frequency based on the corrected control code value of LPF_code*X.

3. The method of claim 2, wherein the corrected cut-off frequency is obtained by $1000/(2\pi*100*LPF\_code*X)$, where the control code value LPF_code is an initial control code value.

4. The method of claim 1, wherein the first gain value is a first pass power that is obtained based on a first signal that is output from the analog filter by applying, to an input of the reception device, a signal of a single tone having a frequency that is lower than the cut-off frequency used to obtain the measured transfer function curve; and
   wherein the second gain value is a second pass power that is obtained based on a second signal that is output from the analog filter by applying, to the input of the reception device, a signal of a single tone having a second cut-off frequency used to obtain the ideal transfer function curve.

5. The method of claim 4, wherein the critical error value is 3 decibels (dB).

6. A reception device for wireless communication and for setting a cut-off frequency of an analog filter, comprising:
   a digital processing unit for obtaining a deviation value corresponding to an error between a first gain value based on an ideal transfer function curve and a second gain value based on a measured transfer function curve at an arbitrary frequency of a frequency band in which a constant interval is maintained between a slope of the ideal transfer function curve and a slope of the measured transfer function curve; and
   a cut-off frequency setting unit for correcting the cut-off frequency that is used in the analog filter to measure the measured transfer function curve in a real environment, based on the obtained deviation value,
   wherein the digital processing unit:
   maintains the first gain value constant despite a change in frequency on both the ideal transfer function curve and the measured transfer function curve;
   obtains the second gain value at an arbitrary frequency belonging to a frequency band in which a gain value varies depending on a change in frequency on both the ideal transfer function curve and the measured transfer function curve; and
   obtains the deviation value by subtracting the second gain value and a critical error value from the first gain value.

7. The reception device of claim 6, wherein the cut-off frequency setting unit estimates a constant value X based on the obtained deviation value, corrects a control code value LPF_code by the estimated constant value X, and obtains a corrected cut-off frequency based on the corrected control code value of LPF_code*X.

8. The reception device of claim 7, wherein the cut-off frequency setting unit obtains the corrected cut-off frequency by $1000/(2\pi*100*LPF\_code*X)$, where the control code value LPF_code is an initial control code value.

9. The reception device of claim 6, wherein the first gain value is a first pass power that is obtained based on a first signal that is output from the analog filter by applying, to an input of the reception device, a first signal of a single tone having a frequency that is lower than the cut-off frequency used to obtain the measured transfer function curve; and
   wherein the second gain value is a second pass power that is obtained based on a second signal that is output from the analog filter by applying, to the input of the reception device, a second signal of a single tone having a second cut-off frequency used to obtain the ideal transfer function curve.

10. The reception device of claim 9, wherein the critical error value is 3 decibels (dB).